US006647120B2

(12) United States Patent
Howze

(10) Patent No.: US 6,647,120 B2
(45) Date of Patent: Nov. 11, 2003

(54) LOUDSPEAKER PROTECTION CIRCUIT RESPONSIVE TO TEMPERATURE OF LOUDSPEAKER DRIVER MECHANISM

(75) Inventor: Bruce Howze, Broomall, PA (US)

(73) Assignee: Community Light and Sound, Inc., Chester, PA (US)

( * ) Notice: Subject to any disclaimer, the term of this patent is extended or adjusted under 35 U.S.C. 154(b) by 0 days.

(21) Appl. No.: 10/114,143

(22) Filed: Apr. 1, 2002

(65) Prior Publication Data

US 2002/0146135 A1 Oct. 10, 2002

Related U.S. Application Data

(60) Provisional application No. 60/281,584, filed on Apr. 5, 2001.

(51) Int. Cl.[7] ........................................ H03G 11/00
(52) U.S. Cl. ........................................ 381/55; 381/189
(58) Field of Search ........................................ 381/55, 59, 96, 381/58, 164, 189, 397, 123, 124, 111

(56) References Cited

U.S. PATENT DOCUMENTS 3,925,708 A 12/1975 Picciochi
3,959,735 A * 5/1976 GrosJean ..................... 381/55
4,093,822 A 6/1978 Steinle
4,296,278 A 10/1981 Cullison et al.
4,330,686 A * 5/1982 Roe ..................... 381/55
4,864,624 A * 9/1989 Tichy ..................... 381/55
5,528,695 A * 6/1996 Klippel ..................... 381/59
5,729,611 A * 3/1998 Bonneville ..................... 381/55
5,751,818 A 5/1998 Gertz et al.
5,793,874 A * 8/1998 Camire ..................... 381/57
6,163,613 A 12/2000 Cowans
6,201,680 B1 * 3/2001 Takatian ..................... 361/119

FOREIGN PATENT DOCUMENTS

DE 2356731 * 5/1975 ............ H04R/3/00

OTHER PUBLICATIONS

Loudspeakers–Application Note; Raychem Circuit Protection Devices.

Adrian Mikolajczak, Meeting IEEE 1394, Overcurrent Protection Requirements Using PolySwitch Devices.

Website page printout–tyco/Electronics–Power Components.

PolySwitch Resettable Devices–tyco/Electronics, Raychem Circuit Protection–Short–Form Catalog Nov. 2001.

* cited by examiner

*Primary Examiner*—Xu Mei
(74) *Attorney, Agent, or Firm*—Akin Gump Strauss Hauer & Feld, L.L.P.

(57) ABSTRACT

A thermal protection circuit for a loudspeaker system includes a load device that is connected in series with a loudspeaker driver mechanism, and a thermally sensitive resettable switch that is connected in parallel with the load device and thermally connected to the loudspeaker driver mechanism, such that heat generated by the loudspeaker driver mechanism is at least conductively transferable to the switch. The switch is changeable between a closed state wherein the load device is at least substantially bypassed, and an open state wherein the electrical signal from an amplifier or crossover circuit is at least substantially directed through the load device when a temperature of the switch is above a predetermined temperature and the electrical signal is above a predetermined signal level. As the temperature of the loudspeaker driver mechanism increases, the temperature of the switch also increases, which in turn decreases the signal level required to trip the switch.

25 Claims, 3 Drawing Sheets

LOUDSPEAKER PROTECTION CIRCUIT RESPONSIVE TO TEMPERATURE OF LOUDSPEAKER DRIVER MECHANISM

CROSS-REFERENCE TO RELATED APPLICATIONS

This application claims the benefit of U.S. Provisional Application No. 60/281,584 filed on Apr. 5, 2001, the disclosure of which is hereby incorporated by reference.

BACKGROUND OF THE INVENTION

The present invention relates generally to loudspeaker systems, and more particularly, to a protection circuit for a loudspeaker system that is responsive to the temperature of the loudspeaker driver mechanism for controlling loudspeaker operation.

It is common practice to provide protection circuits for loudspeaker systems in order to protect the loudspeaker driver mechanisms from excessive power levels. A common protection circuit, utilized for loudspeaker systems, employs a thermally sensitive resettable fuse with a power resistor in parallel. This protection circuit is wired in series with the loudspeaker driver mechanism. When the current passing through the thermally sensitive resettable fuse and the loudspeaker driver mechanism exceeds the current capacity of the thermally sensitive resettable fuse, the thermally sensitive resettable fuse opens, like a circuit breaker, and the power resistor becomes connected in series with the loudspeaker driver mechanism. The power resistor reduces the current through the protection circuit and the voltage on the loudspeaker driver mechanism, thus reducing the power applied to the loudspeaker driver mechanism and keeping it within a safe operating range.

Since loudspeaker driver mechanisms can handle more power when they are cold and less power when they are hot, it is advantageous to have a loudspeaker protection circuit that performs its function of protecting the loudspeaker system at progressively lower current levels as the loudspeaker driver mechanism progressively increases in temperature. The loudspeaker protection circuit in accordance with the invention performs this function.

SUMMARY OF THE INVENTION

In accordance with one aspect of the invention, a thermal protection circuit for a loudspeaker system is provided. The loudspeaker system may include a loudspeaker driver mechanism adapted for connection to a signal supply mechanism for providing an electrical signal to the driver mechanism. The thermal protection circuit includes an input that is adapted to receive an electrical signal from the signal supply mechanism and an output that is adapted to apply the electrical signal to the driver mechanism. The thermal protection circuit further includes a load device that is connected in series with the input and the output for reducing the power of the electrical signal before reaching the driver mechanism, and a first normally closed, thermally sensitive switch that is connected in parallel with the load device. The first switch is also thermally connectable to the driver mechanism such that heat generated by the driver mechanism is at least conductively transferable to the first switch. The first switch is changeable between a closed state wherein the load device is at least substantially bypassed, and an open state wherein the electrical signal is at least substantially directed through the load device when a temperature of the first switch is above a predetermined temperature and the electrical signal is above a predetermined signal level.

In accordance with a further aspect of the invention, a loudspeaker system includes a loudspeaker driver mechanism adapted for connection to a signal supply mechanism for providing an electrical signal to the driver mechanism, and a thermal protection circuit connected in series with the driver mechanism. The thermal protection circuit has a load device that is connected in series with the driver mechanism for reducing a power of the electrical signal before reaching the driver mechanism, and a first normally closed, thermally sensitive switch that is connected in parallel with the load device and thermally connected to the driver mechanism such that heat generated by the driver mechanism is at least conductively transferred to the first switch. The first switch is changeable between a closed state wherein the load device is at least substantially bypassed, to an open state wherein the electrical signal is at least substantially directed through the load device when a temperature of the first switch is above a predetermined temperature and the electrical signal is above a predetermined signal level.

In accordance with an even further aspect of the invention, a method of protecting a loudspeaker system against thermal overload includes connecting a load device in series with a loudspeaker driver mechanism and connecting a thermally sensitive switch across the load device. The thermally sensitive switch is changeable between a closed state wherein electrical current from a signal supply mechanism is at least substantially directed through the thermally sensitive switch, and an open state wherein the electrical current is at least substantially directed through the load device. The method further includes increasing the temperature of the thermally sensitive switch by conductively transferring heat from the driver mechanism to the thermally sensitive switch and by directing the electrical current through the thermally sensitive switch, and automatically changing the thermally sensitive switch from the closed state to the open state when the temperature of the thermally sensitive switch is above a predetermined temperature and the electrical current is above a predetermined current level.

BRIEF DESCRIPTION OF THE SEVERAL VIEWS OF THE DRAWINGS

The foregoing summary, as well as the following detailed description of preferred embodiments of the invention, will be better understood when read in conjunction with the appended drawings. For the purpose of illustrating the invention, there is shown in the drawings embodiments which are presently preferred. It should be understood, however, that the invention is not limited to the precise arrangements and instrumentalities shown.

In the drawings.

DETAILED DESCRIPTION OF THE INVENTION

Figure 1:
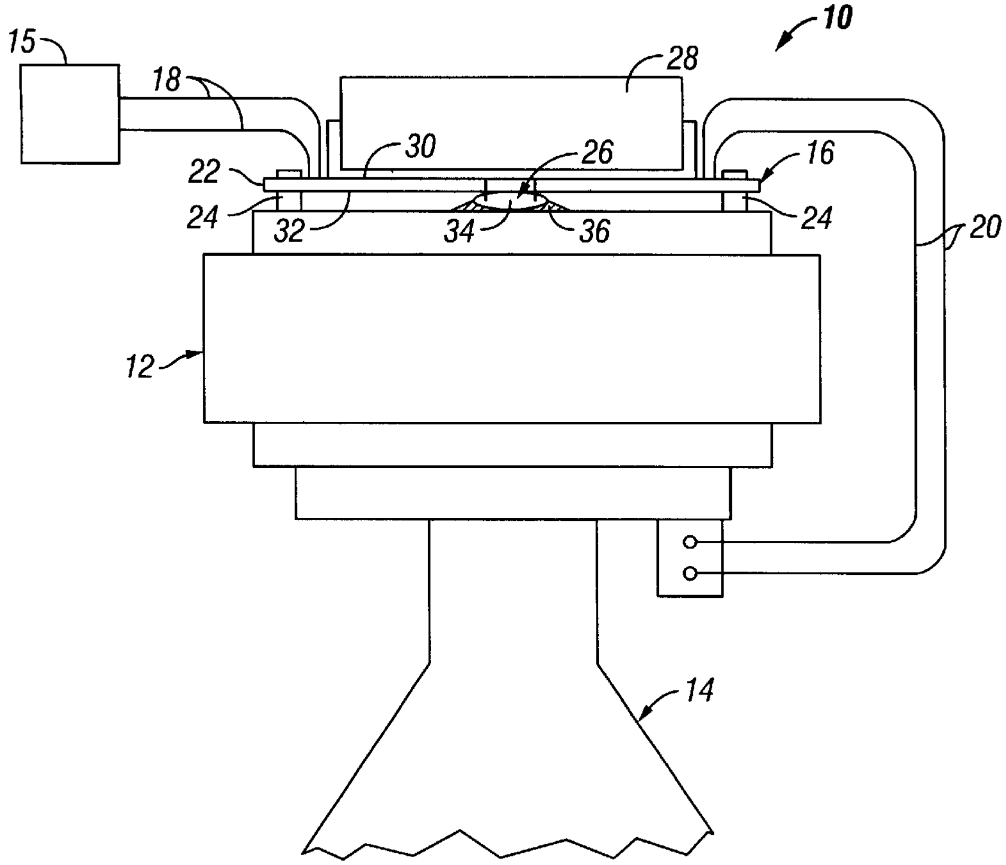
FIG. 1 is a schematic view of a loudspeaker system incorporating a thermal protection circuit in accordance with the present invention.
Figure 2:
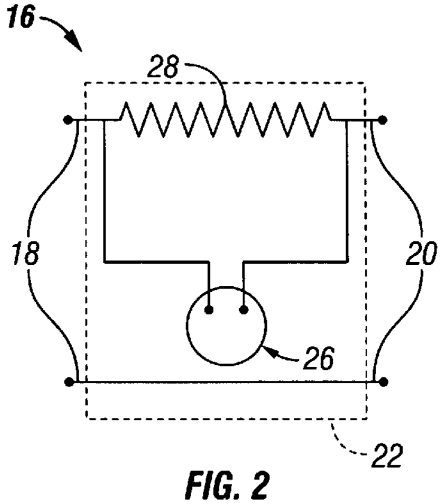
FIG. 2 is a schematic view of the thermal protection circuit in accordance with a first embodiment of the invention.

Referring now to the drawings, and to FIGS. 1 and 2 in particular, a loudspeaker system 10 in accordance with an exemplary embodiment of the invention is illustrated. The loudspeaker system 10 includes a loudspeaker driver mechanism 12 connected to a loudspeaker horn 14 in a well-known manner, a signal supply mechanism 15 for supplying a drive signal to the driver mechanism 12, and a thermal protection circuit 16 that responds to changes in temperature of the driver mechanism 12. The thermal protection circuit 16 is wired in series with the signal supply mechanism 15 and the driver mechanism 12, with an input 18 feeding into the protection circuit 16 from the signal supply mechanism 15, and an output 20 feeding into the driver mechanism 12 from the protection circuit 16. The signal supply mechanism 15 may comprise an amplifier or crossover circuit (not shown), or any other device for providing electrical signals, either directly or indirectly, to the driver mechanism 12. The driver mechanism is preferably of conventional construction, and therefore will not be further described.

The thermal protection circuit 16 includes a circuit board 22 that is preferably mounted to the driver mechanism 12 through well-known attaching hardware 24, a thermally sensitive switch 26, preferably in the form of a resettable fuse electrically connected to the circuit board 22, and a load device 28, preferably in the form of a power resistor electrically connected to the circuit board 22 in parallel with the resettable fuse 26. Preferably, the power resistor 28 is mounted on one side 30 of the circuit board, and the resettable fuse 26 is mounted on the opposite side 32 of the circuit board. The resettable fuse 26 includes a housing 34 that is preferably both physically and thermally connected to the driver mechanism 12 through a thermally conductive adhesive 32 or other thermally conductive means. The housing 34 is preferably oriented with respect to the driver mechanism 12 so that a maximum surface area of the housing 34 is exposed to heat from the driver mechanism. By way of example, a suitable thermally sensitive resettable fuse is available from Tyco Electronics Corporation of Menlo Park, Calif. under the trade name PolySwitch™. Resettable fuses of this type are constructed of a conductive polymer that is sensitive to electrical current. When excessive current passes through the conductive polymer of the resettable fuse 26, the temperature of the polymer increases and changes its crystalline structure to an expanded amorphous state, thereby causing a dramatic increase in its resistance and reducing the amount of current flow through the resettable fuse to a minimal level. When the housing 30 of the resettable fuse 26 is exposed to increasing temperature from an outside heat source, the polymer of the resettable fuse also increases in temperature, thereby reducing the amount of current required to trip the resettable fuse.

In operation, and by way of example, an audio signal is sent from the signal supply mechanism 15 to the input 18 of the protection circuit 16. During normal operation, electrical current from the signal passes through the thermally sensitive resettable fuse 26 prior to reaching the driver mechanism 12 via the output 20. In this manner, the load device 28 is at least substantially bypassed so that the full power from the signal supply mechanism 15 is available for the driver mechanism 12. With the thermally sensitive resettable fuse 26 in thermal contact with the loudspeaker driver mechanism 12, the protection threshold, i.e. the threshold at which the resettable fuse 26 trips open, is thermally sensitive to the temperature of the loudspeaker driver mechanism 12. As the temperature of the driver mechanism 12 rises, the housing 34 of the resettable fuse 26 also rises in temperature due to conductive heat transfer from direct contact of the housing 34 with the driver mechanism 12, and/or from indirect contact through the thermally conductive adhesive 36. The housing 34 may also rise in temperature due to convective heat transfer between the driver mechanism 12 and the housing. The rise in temperature of the housing 34 in turn causes a corresponding rise in temperature of the conductive polymer within the housing. Accordingly, an increase in temperature of the driver mechanism 12 causes a corresponding decrease in current capacity, and thus a corresponding decrease in the protection threshold, of the resettable fuse 26.

When the current capacity of the resettable fuse 26 is exceeded, the thermally sensitive resettable fuse 26 trips open and causes the current to flow through the power resistor 28, which is now in series with the loudspeaker driver mechanism 12. The power resistor 28 reduces the current through the protection circuit 16, as well as the current and voltage applied to the driver mechanism 12 to thereby reduce the power applied to the driver mechanism and keep it within a safe operating range. Upon sufficient cooling, the resettable fuse 26 automatically closes to redirect the current through the resettable fuse.

With the above-described arrangement, higher current can be fed to the driver mechanism 12 when it is relatively cold or within an acceptable operating temperature range without tripping the resettable fuse 26, while less current will trip the resettable fuse 26 when the driver mechanism 12 is operating at higher temperatures to thereby protect the loudspeaker system 10 against thermal overload.

Figure 3:
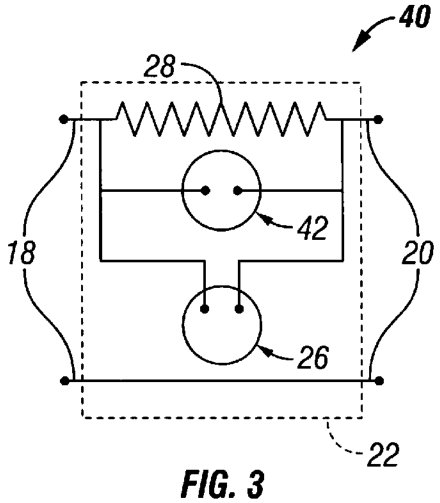
FIG. 3 is a schematic view of the thermal protection circuit in accordance with a second embodiment of the invention.

Referring now to FIG. 3, a protection circuit 40 in accordance with a second embodiment of the invention is illustrated. The protection circuit 40 is similar in construction to the protection circuit 16, with the addition of a further thermally sensitive resettable switch or fuse 42 that is connected in parallel with the thermally sensitive resettable fuse 26. Preferably, the resettable fuse 42 is mounted on the printed circuit board 22, but not thermally connected to the loudspeaker driver mechanism 12. With this arrangement, the amount of thermal feedback applied to the protection circuit 40 can vary depending on the selected capacities of the resettable fuses 26 and 42. By way of example, for a high frequency compression driver mechanism having a power capacity of ten watts, the resettable fuse 26 can be chosen with a capacity of 0.5 amps and the resettable fuse 42 can be chosen with a capacity of 0.25 amps, with the power resistor 28 having a value of 20 ohms and a power capacity of five watts. With these values, the resettable fuse 26 will trip open before the resettable fuse 42 when the temperature transferred to the resettable fuse 26 from the driver mechanism 12 reduces the protection threshold to a capacity that is less than the capacity of the resettable fuse 42. Once the resettable fuse 26 is tripped, the resettable fuse 42 will also trip in a relatively short time since the current through the resettable fuse 42 will be much greater. Thus, higher current can be fed to the driver mechanism when it is relatively cold or within an acceptable operating temperature range without tripping the resettable fuses, while less current will trip the resettable fuses when the driver mechanism is operating at higher temperatures to thereby protect the loudspeaker system 10 against thermal overload. It will be understood that the above values are given by way of example only, and that such values can greatly vary depending on the rated power of the speaker system, the type of driver mechanism used, the normal operating temperature of the driver mechanism, the desired response time to an overload condition, as well as other factors.

Figure 4:
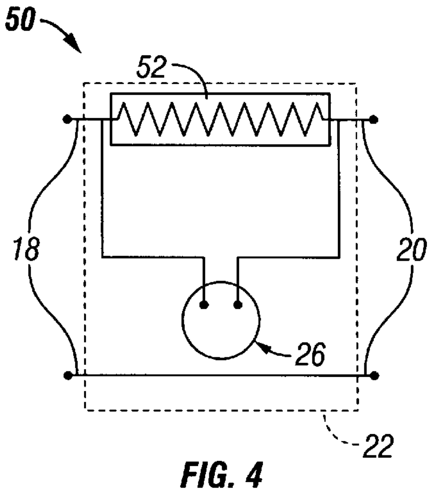
FIG. 4 is a schematic view of the thermal protection circuit in accordance with a third embodiment of the invention.

With reference now to FIG. 4, a protection circuit 50 in accordance with a third embodiment of the invention is illustrated. The protection circuit 50 is similar in construction to the protection circuit 16 previously described, with the exception that the power resistor 28 is replaced with another load device or voltage dropping element in the form of a light source 52, such as an incandescent light bulb. When the resettable fuse 26 is tripped open, current will flow through the light source 52 to create a visual indication that the protection circuit 50 has been activated. The light source 52 can also provide a smoother transition into the protection mode due to its non-linear variation of resistance with current.

Figure 5:
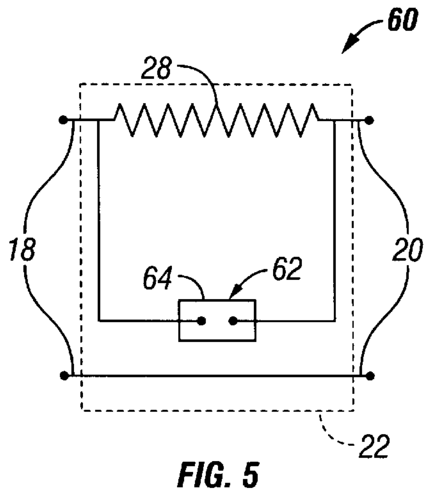
FIG. 5 is a schematic view of the thermal protection circuit in accordance with a fourth embodiment of the invention.

With reference now to FIG. 5, a protection circuit 60 in accordance with a fourth embodiment of the invention is illustrated. The protection circuit 60 is similar in construction to the protection circuit 16 previously described, with the exception that the thermally sensitive resettable fuse 26 is replaced with an automatically resettable switch in the form of a circuit breaker 62. The circuit breaker 62 is mounted to the circuit board 22 in a similar manner as the resettable fuse 26, with a housing 64 of the circuit breaker in thermal contact with the driver mechanism 12 (FIG. 1) so that heat from the driver mechanism is at least conductively transferred to the circuit breaker 62. The circuit breaker 62 is thermally sensitive and preferably provides a similar thermal feedback function to that of the thermally sensitive resettable fuse 26.

Figure 6:
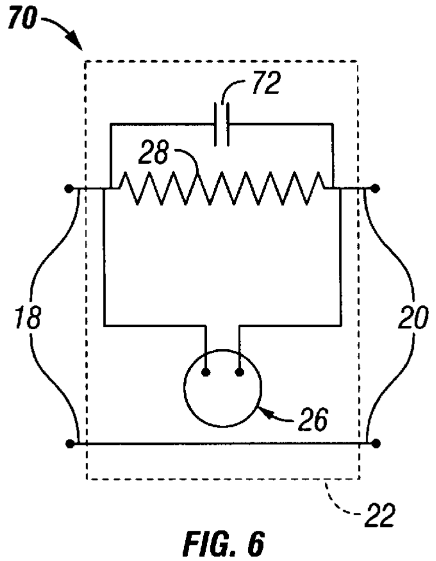
FIG. 6 is a schematic view of the thermal protection circuit in accordance with a fifth embodiment of the invention.

With reference now to FIG. 6, a protection circuit 70 in accordance with a fifth embodiment of the invention is illustrated. The protection circuit 70 is similar in construction to the protection circuit 16 previously described, with the addition of a capacitor 72 that is electrically connected in parallel with the power resistor 28 on the circuit board 22. The capacitor 72 serves to maintain a flat frequency response in the protection mode when the output of the protection circuit 70 is connected to a crossover network (not shown) and a high frequency loudspeaker driver mechanism. Without the capacitor 72 in parallel with the power resistor 28, the high frequency response of the loudspeaker system would be diminished upon activation of the protection circuit 70 because the impedance of the crossover network and high frequency loudspeaker driver mechanism would decrease with increasing frequency, thereby causing an increased voltage drop across the power resistor 28. In one exemplary embodiment of the invention for a high frequency loudspeaker driver mechanism and a crossover network, the value of the capacitor 72 is approximately is 1.5 mfd.

Figure 7:
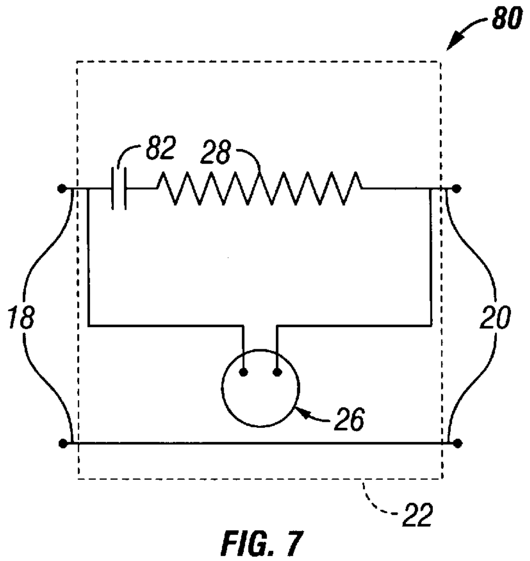
FIG. 7 is a schematic view of the thermal protection circuit in accordance with a sixth embodiment of the invention.

With reference now to FIG. 7, a protection circuit 80 in accordance with a sixth embodiment of the invention is illustrated. The protection circuit 80 is similar in construction to the protection circuit 16 previously described, with the addition of a capacitor 82 electrically connected in series with the power resistor 28 on the circuit board 22. The capacitor 82 provides additional protection in the lower frequency ranges when the protection circuit 80 is activated.

Figure 8:
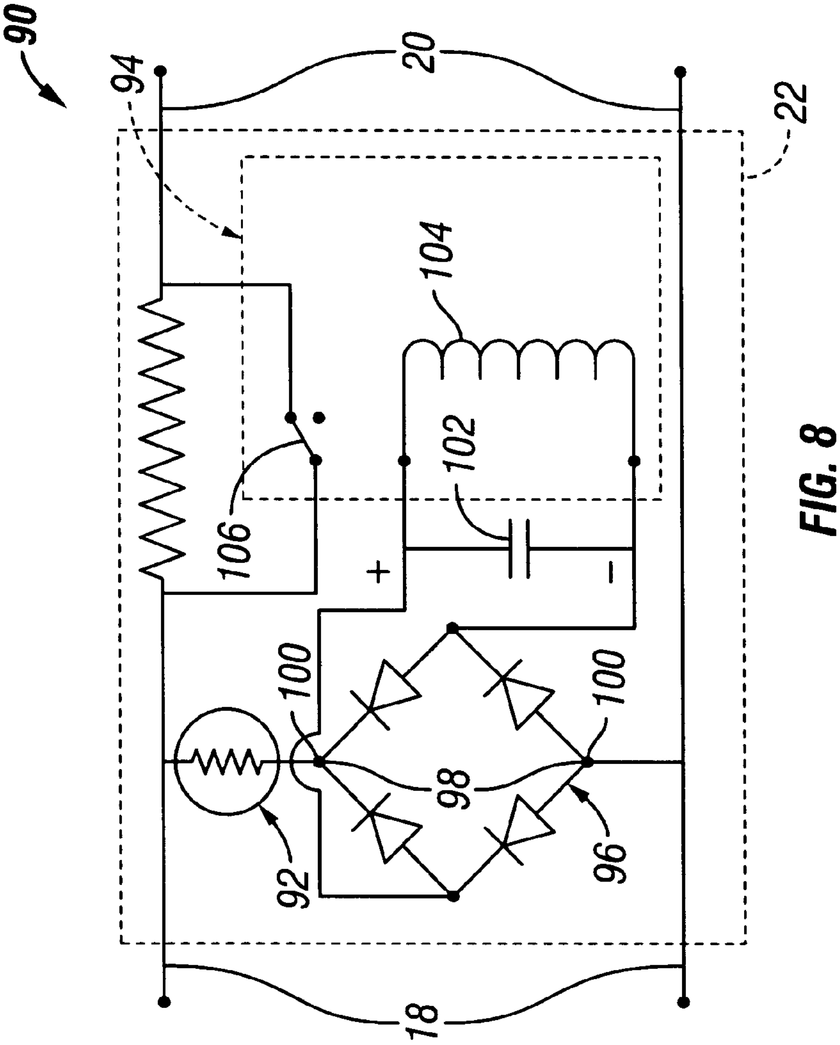
FIG. 8 is a schematic view of the thermal protection circuit in accordance with a seventh embodiment of the invention.

With reference now to FIG. 8, a protection circuit 90 in accordance with a seventh embodiment of the invention is illustrated. The protection circuit 90 includes a switch in the form of a thermistor 92 and a DC relay 94 that replace the thermally sensitive resettable fuse 26 in the protection circuit 16. The thermistor 92 is electrically connected to the circuit board 22 and thermally connected to the loudspeaker driver mechanism through a thermally conductive adhesive or other thermally conductive means. The thermistor 92 is connected in series with the AC terminals 98 of a full-wave bridge rectifier 96. The DC terminals 100 of the full-wave bridge rectifier 96 are connected to a capacitor 102 and a coil 104 of the DC relay 94. The normally closed switch 106 of the DC relay 94 is connected across the power resistor 22 to thereby bypass the power resistor under normal operating conditions. The protection circuit 90 is activated when sufficient current flows through the coil 104 of the DC relay 94 to cause the normally closed switch 106 to open. Current flow through the coil 104 of the DC relay 94 is partially controlled by the resistance of the thermistor 92, which decreases with increasing temperature to thereby provide thermal feedback for the protection circuit 90. The capacitor 102 serves to smooth the operation of the DC relay 96 and prevent chattering of the switch 106.

It will be appreciated by those skilled in the art that changes could be made to the embodiments described above without departing from the broad inventive concept thereof. It will be understood, therefore, that this invention is not limited to the particular embodiments disclosed, but it is intended to cover modifications within the spirit and scope of the present invention as defined by the appended claims.

I claim:

1. A thermal protection circuit for a loudspeaker system having a loudspeaker driver mechanism adapted for connection to a signal supply mechanism for providing an electrical signal to the loudspeaker driver mechanism, the thermal protection circuit comprising:

an input adapted to receive an electrical signal from a signal supply mechanism;

an output adapted to apply the electrical signal to the loudspeaker driver mechanism;

a load device connected in series with the input and the output for reducing a power of the electrical signal before reaching the loudspeaker driver mechanism; and a first normally closed, thermally sensitive switch connected in parallel with the load device and thermally connectable to the loudspeaker driver mechanism such that heat generated by the loudspeaker driver mechanism is at least conductively transferable to the first switch, the first switch being changeable between a closed state wherein the load device is at least substantially bypassed, and an open state wherein the electrical signal is at least substantially directed through the load device when a temperature of the first switch is above a predetermined temperature and the electrical signal is above a first predetermined signal level.

2. A thermal protection circuit according to claim 1, wherein the first switch is automatically changeable from the open state to the closed state when the temperature of the first switch is equal to or below the predetermined temperature and the electrical signal is equal to or less than the predetermined signal level.

3. A thermal protection circuit according to claim 2, wherein the first switch is constructed so that an increase in temperature of the first switch results in a decrease in the predetermined signal level at which the first switch changes from the closed state to the open state.

4. A thermal protection circuit according to claim 3, and further comprising a second normally closed switch connected in parallel with the first switch, the second switch being changeable between a closed state wherein the load device is at least substantially bypassed, and an open state wherein the electrical signal is at least substantially directed through one of the first switch and the load device when the electrical signal is above a second predetermined signal level.

5. A thermal protection circuit according to claim 4, wherein the second switch has a power rating that is less than a power rating of the first switch.

6. A thermal protection circuit according to claim 1, and further comprising a second normally closed switch connected in parallel with the first switch, the second switch being changeable between a closed state wherein the load device is at least substantially bypassed, and an open state wherein the electrical signal is at least substantially directed through one of the first switch and the load device when the electrical signal is above a second predetermined signal level.

7. A thermal protection circuit according to claim 6, wherein the second switch has a power rating that is less than a power rating of the first switch.

8. A thermal protection circuit according to claim 1, wherein the first switch is constructed so that an increase in temperature of the first switch results in a decrease in the first predetermined signal level at which the first switch changes from the closed state to the open state.

9. A thermal protection circuit according to claim 1, wherein a capacitor is connected in parallel with the first switch to thereby maintain a substantially flat frequency response when the first switch is changed from the closed state to the open state.

10. A thermal protection circuit according to claim 1, wherein a capacitor is connected in series with the first switch.

11. A thermal protection circuit according to claim 1, wherein the load device is a power resistor.

12. A thermal protection circuit according to claim 1, wherein the load device is a light bulb.

13. A loudspeaker system, comprising:

- a loudspeaker driver mechanism adapted for connection to a signal supply mechanism for providing an electrical signal to the loudspeaker driver mechanism; and
- a thermal protection circuit connected in series with the loudspeaker driver mechanism, the thermal protection circuit comprising:
  - a load device connected in series with the loudspeaker driver mechanism for reducing a power of the electrical signal before reaching the loudspeaker driver mechanism; and
  - a first normally closed, thermally sensitive switch connected in parallel with the load device and thermally connected to the loudspeaker driver mechanism such that heat generated by the loudspeaker driver mechanism is at least conductively transferred to the first switch, the first switch being changeable between a closed state wherein the load device is at least substantially bypassed, to an open state wherein the electrical signal is at least substantially directed through the load device when a temperature of the first switch is above a predetermined temperature and the electrical signal is above a first predetermined signal level.

14. A loudspeaker system according to claim 13, wherein the first switch is automatically changeable from the open state to the closed state when the temperature of the first switch is equal to or below the predetermined temperature and the electrical signal is equal to or less than the predetermined signal level.

15. A loudspeaker system according to claim 14, wherein the first switch is constructed so that an increase in temperature of the first switch results in a decrease in the predetermined signal level at which the first switch changes from the closed state to the open state.

16. A loudspeaker system according to claim 15, and further comprising a second normally closed switch connected in parallel with the first switch, the second switch being changeable between a closed state wherein the load device is at least substantially bypassed, and an open state wherein the electrical signal is at least substantially directed through one of the first switch and the load device when the electrical signal is above a second predetermined signal level.

17. A loudspeaker system according to claim 16, wherein the second switch has a power rating that is less than a power rating of the first switch.

18. A loudspeaker system according to claim 13, and further comprising a second normally closed switch connected in parallel with the first switch, the second switch being changeable between a closed state wherein the load device is at least substantially bypassed, and an open state wherein the electrical signal is at least substantially directed through one of the first switch and the load device when the electrical signal is above a second predetermined signal level.

19. A loudspeaker system according to claim 18, wherein the second switch has a power rating that is less than a power rating of the first switch.

20. A loudspeaker system according to claim 13, wherein the first switch is constructed so that an increase in temperature of the first switch results in a decrease in the predetermined signal level at which the first switch changes from the closed state to the open state.

21. A loudspeaker system according to claim 13, wherein the first switch is thermally mounted to the loudspeaker driver mechanism through a thermally conductive adhesive.

22. A method of protecting a loudspeaker system against thermal overload, the loudspeaker system having a loudspeaker driver mechanism adapted for connection to a signal supply mechanism for providing an electrical signal to the loudspeaker driver mechanism, the method comprising:

- connecting a load device in series with the loudspeaker driver mechanism;
- connecting a thermally sensitive switch across the load device, the thermally sensitive switch being changeable between a closed state wherein electrical current from the electrical signal is at least substantially directed through the thermally sensitive switch, and an open state wherein the electrical current is at least substantially directed through the load device;
- increasing the temperature of the thermally sensitive switch by conductively transferring heat from the loudspeaker driver mechanism to the thermally sensitive switch and by directing the electrical current through the thermally sensitive switch; and
- automatically changing the thermally sensitive switch from the closed state to the open state when the temperature of the thermally sensitive switch is above a predetermined temperature and the electrical current is above a predetermined current level.

23. A method according to claim 22, and further comprising automatically changing the switch from the closed state to the open state at progressively lower current levels as the thermally sensitive switch progressively increases in temperature.

24. A method according to claim 23, and further comprising automatically changing the thermally sensitive switch from the open state to the closed state when the temperature of the thermally sensitive switch is at or below the predetermined temperature and the electrical current is at or below the predetermined current level.

25. A method according to claim 22, and further comprising automatically changing the thermally sensitive switch from the open state to the closed state when the temperature of the thermally sensitive switch is at or below the predetermined temperature and the electrical current is at or below the predetermined current level.

* * * * *